United States Patent
Agarwal et al.

(10) Patent No.: US 9,425,076 B2
(45) Date of Patent: Aug. 23, 2016

(54) SUBSTRATE TRANSFER ROBOT END EFFECTOR

(71) Applicant: APPLIED MATERIALS, INC., Santa Clara, CA (US)

(72) Inventors: Pulkit Agarwal, Milpitas, CA (US);
Daniel Greenberg, San Jose, CA (US);
Song-Moon Suh, San Jose, CA (US);
Jeffrey Brodine, Los Gatos, CA (US);
Steven V. Sansoni, Livemore, CA (US);
Glen Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/476,224

(22) Filed: Sep. 3, 2014

(65) Prior Publication Data
US 2016/0005638 A1    Jan. 7, 2016

Related U.S. Application Data

(60) Provisional application No. 62/020,769, filed on Jul. 3, 2014.

(51) Int. Cl.
*B66F 19/00* (2006.01)
*H01L 21/687* (2006.01)
*H01L 21/677* (2006.01)

(52) U.S. Cl.
CPC .... *H01L 21/68707* (2013.01); *H01L 21/67766* (2013.01)

(58) Field of Classification Search
CPC ............. H01L 21/68707; H01L 21/6838; H01L 21/67201; H01L 21/67769; H01L 21/67766; B25J 9/023

USPC ........................................... 294/213
See application file for complete search history.

(56) References Cited

U.S. PATENT DOCUMENTS 6,722,834 B1 *   4/2004   Tepman ................. 414/217
7,654,596 B2 *   2/2010   Mantz .................. 294/103.1
(Continued)

FOREIGN PATENT DOCUMENTS

EP     1 063 683 A2    12/2000
JP     H06-151195 A     5/1994
(Continued)

OTHER PUBLICATIONS

International Search Report and Written Opinion mailed Aug. 31, 2015 for PCT Application No. PCT/US2015/034333.

*Primary Examiner* — Stephen Vu
(74) *Attorney, Agent, or Firm* — Moser Taboada; Alan Taboada

(57) ABSTRACT

Embodiments of apparatus for supporting a substrate are disclosed herein. In some embodiments, an apparatus for supporting a substrate includes a support member; and a plurality of substrate contact elements protruding from the support member, wherein each of the plurality of substrate contact elements includes: a first contact surface to support a substrate when placed thereon; and a second contact surface extending from the first contact surface, wherein the second contact surface is adjacent a periphery of the substrate to prevent radial movement of the substrate, wherein the first contact surface is at a first angle with respect to the support member and the second contact surface is at a second angle with respect to the support member, and wherein the first angle is between about 3 degrees and 5 degrees.

18 Claims, 3 Drawing Sheets

(56) References Cited

U.S. PATENT DOCUMENTS

| | | | |
|---|---|---|---|
| 7,748,760 B2* | 7/2010 | Kushida et al. | 294/213 |
| 8,382,180 B2* | 2/2013 | Kanawade et al. | 294/213 |
| 2004/0113444 A1* | 6/2004 | Blonigan et al. | 294/1.1 |
| 2007/0151515 A1* | 7/2007 | Kim | 118/719 |
| 2008/0267747 A1 | 10/2008 | DiBella et al. | |
| 2012/0049555 A1* | 3/2012 | Fujii et al. | 294/213 |
| 2015/0170954 A1 | 6/2015 | Agarwal et al. | |

FOREIGN PATENT DOCUMENTS

| | | |
|---|---|---|
| JP | 2004-266202 A | 9/2004 |
| JP | 2010-239023 A | 10/2010 |

* cited by examiner

SUBSTRATE TRANSFER ROBOT END EFFECTOR

CROSS-REFERENCE TO RELATED APPLICATIONS

This application claims benefit of U.S. provisional patent application Ser. No. 62/020,769, filed Jul. 3, 2014, which is herein incorporated by reference.

FIELD

Embodiments of the present disclosure generally relate to semiconductor processing equipment.

BACKGROUND

In the fabrication of microelectronic devices on semiconductor substrates, the semiconductor substrate is handled on its edge and backside numerous times during the manufacturing process. Such handling can cause contaminants to adhere to the backside of the substrate and travel between processing components, for example, from chamber to chamber, FOUP (front opening unified pod) to FOUP, or process tool to process tool along with the substrate, or between different substrates, undesirably increasing tool downtime for maintenance to remove the contaminants. These contaminants can also migrate to the front side of the substrate, resulting in reduced device performance and/or yield loss.

Typical solutions to this problem have been to reduce the backside particle generation by reducing a contact area between the substrate and substrate transferring/handling devices. However, while this solution mitigates particle generation, the inventors have observed that large numbers of particles are still generated even with the smallest contact areas contemplated.

As such, the inventors have provided embodiments of improved apparatus for supporting and handling a substrate with reduced particle generation.

SUMMARY

Embodiments of apparatus for supporting a substrate are disclosed herein. In some embodiments, an apparatus for supporting a substrate includes a support member; and a plurality of substrate contact elements protruding from the support member, wherein each of the plurality of substrate contact elements includes: a first contact surface to support a substrate when placed thereon; and a second contact surface extending from the first contact surface, wherein the second contact surface is adjacent a periphery of the substrate to prevent radial movement of the substrate, wherein the first contact surface is at a first angle with respect to the support member and the second contact surface is at a second angle with respect to the support member, and wherein the first angle is between about 3 degrees and 5 degrees.

In some embodiments, a substrate transfer robot for transferring a substrate includes an arm including a blade; and a plurality of substrate contact elements protruding from an upper surface of the blade. Each of the plurality of substrate contact elements includes a first contact surface to support a substrate when placed thereon; and a second contact surface extending from the first contact surface, wherein the second contact surface is adjacent a periphery of the substrate to prevent radial movement of the substrate, wherein the first contact surface is at a first angle with respect to the upper surface and the second contact surface is at a second angle with respect to the upper surface, and wherein the first angle is between about 3 degrees and 5 degrees.

In some embodiments, a substrate transfer robot for transferring a substrate includes an arm including a blade, wherein the blade is formed of an electrically conductive titanium-doped ceramic; and a plurality of substrate contact elements protruding from an upper surface of the blade. Each of the plurality of substrate contact elements includes a first contact surface to support a substrate when placed thereon; and a second contact surface extending from the first contact surface, wherein the second contact surface is adjacent a periphery of the substrate to prevent radial movement of the substrate, wherein the first contact surface is at a first angle with respect to the upper surface and the second contact surface is at a second angle with respect to the upper surface, wherein the second angle is greater than the first angle; and wherein the first angle is between about 3 degrees and 5 degrees.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
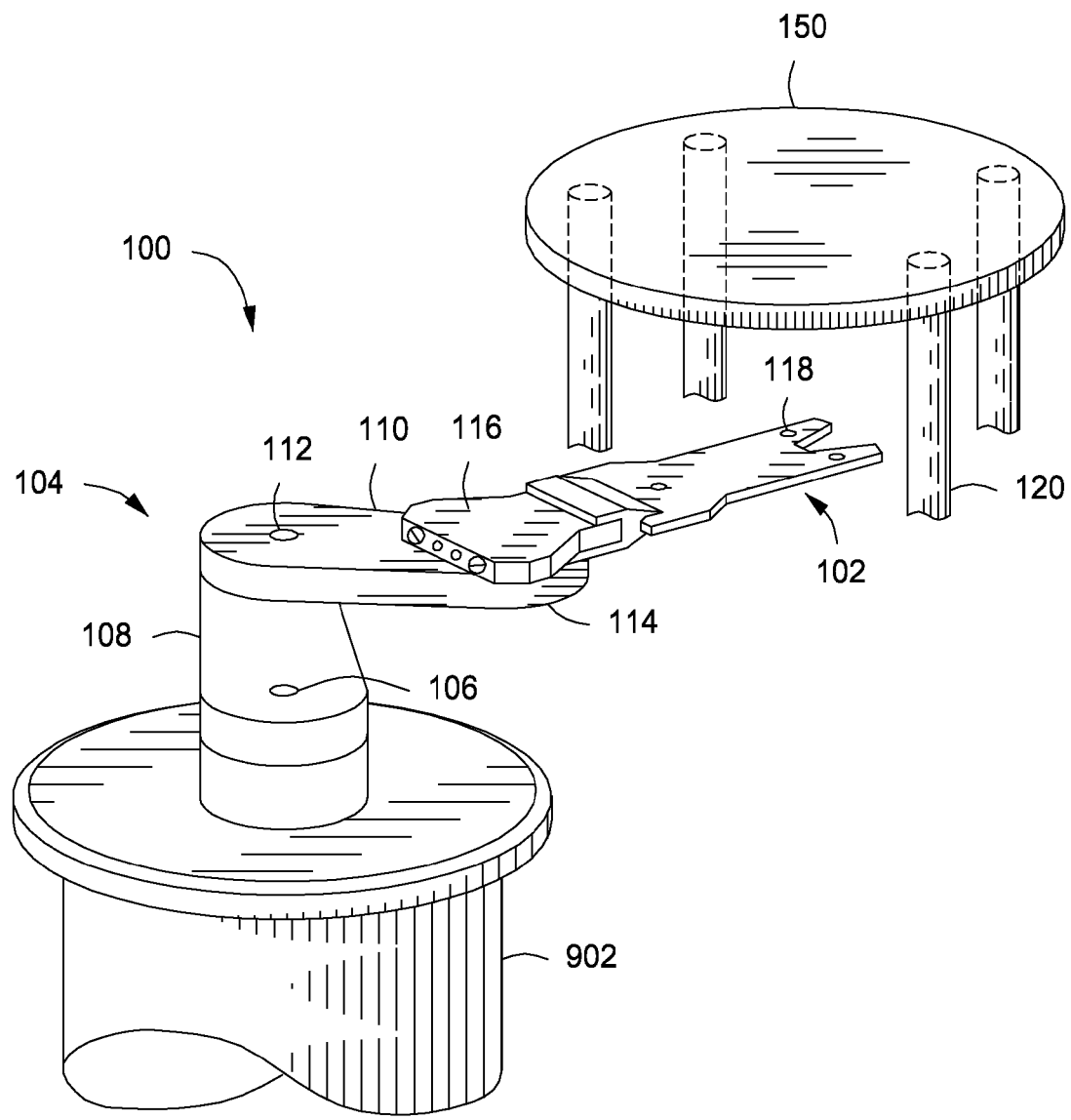
FIG. 1 depicts a schematic view of a substrate transfer robot for transferring a substrate resting on lift pins of a substrate support in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved substrate handling apparatus that provides reduced particle generation as compared to conventional substrate supporting apparatus. Embodiments of the present disclosure may advantageously avoid or reduce contamination accumulated on a substrate during the manufacturing process, such as while handling the substrate between process steps, which can further limit or prevent contaminants from reaching the front-side of a substrate and causing device performance issues and/or yield loss. Embodiments of the present disclosure may be used in a wide variety of surfaces that contact a substrate in processes where very low addition of particles is desired, for example, in display processing, silicon wafer processing, optics manufacturing, and the like.

FIG. 1 depicts a substrate transfer robot 100 according to some embodiments of the present disclosure. For example, a substrate transfer robot 100 may comprise a robot arm (arm 104) for vertical and rotational displacement at a first end 106. The arm 104 may comprise one or more links, for example first link 108 and second link 110 pinned together at axis 112. A second end 114 of the arm 104 may include a wrist 116 to which the first end of a blade 102 is coupled. The blade 102 may include contact pads 118 protruding from an upper surface of the blade to support a substrate. The contact pads 118 are described in more detail below with respect to FIGS. 2 through 6.

In operation, the substrate transfer robot 100 may be controlled such that the blade 102 is positioned below a substrate 150 supported on a plurality of lift pins 120. Through manipulation of the substrate transfer robot 100 and the arm 104, the blade 102 is raised from a position below the substrate 150 to bring the contact pads 118 into contact with at least one of the edge or back side of the substrate 150 and to lift the substrate 150 off of the lift pins 120. When contacting the substrate 150, particles are often generated at the contact area between the contact pads 118 and the substrate 150.

The inventors have discovered that particles are generated when the material of any element that contacts the substrate is harder than the substrate material (e.g., silicon), has a high adhesion to the substrate material, cannot prevent the substrate from sliding, has a rough surface, and is not conductive. For example, if a substrate is initially contacted by an element formed of a sticky material and is later contacted by another element formed of a hard material, the generation of particles on the substrate is exacerbated. Similarly, if there is current flow between the substrate and a conductive material and the substrate is lifted by a non-conductive material, arcing may occur, exacerbating the generation of particles on the substrate.

The inventors have discovered that particle generation can be prevented or substantially minimized by using a material exhibiting a predetermined set of properties in elements that contact the substrate (e.g., contact pads 118). The predetermined set of properties includes: a hardness less than or equal to that of a substrate to be supported (e.g., silicon), non-adhesiveness, a coefficient of static friction high enough to prevent sliding of the substrate on elements that contact the substrate, electrically conductive, and a surface roughness less than or equal to 10 Ra. Such a material may include, for example, one or more of aluminum oxide, silicon nitride, stainless steel, and electrically conductive plastics, such as Kapton®, Kalrez®, Vespel®, and Celazole®. Other process-compatible materials exhibiting the above-noted properties may be used.

Conventional edge contact pads include an edge support surface at a steep angle with respect to a horizontal plane (approximately 60 degrees). The inventors have discovered that upon lifting a substrate, the substrate slides into its final resting position because of the steepness of edge support surface angle. This sliding causes particle generation on the edge of the substrate. Therefore, the inventors have discovered that particle generation can be prevented or substantially minimized by providing edge contact pads with a shallow incline.

Figure 2:
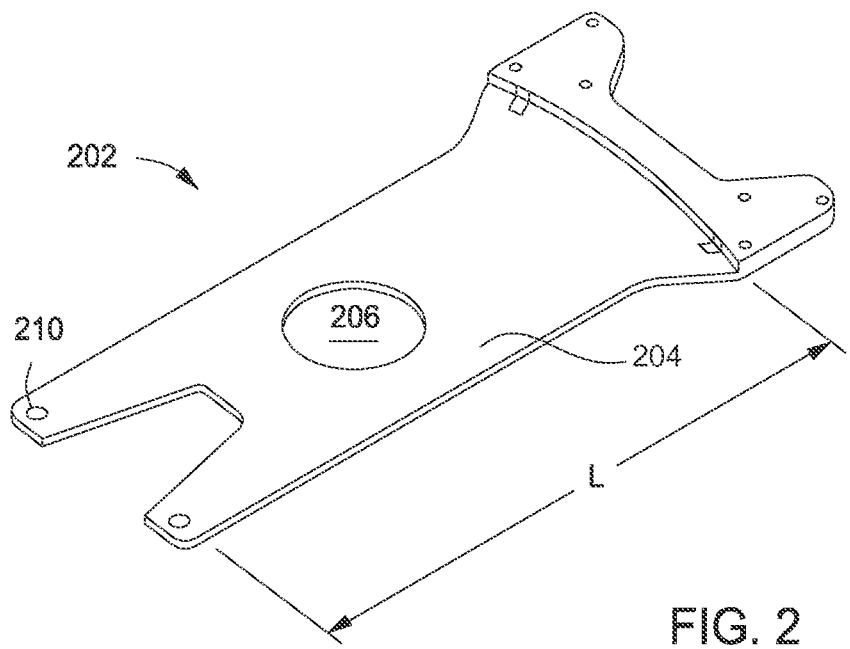
FIG. 2 depicts an isometric view of an end effector of a substrate transfer robot in accordance with some embodiments of the present disclosure.

For example, FIG. 2 depicts an end effector 202 in accordance with some embodiments of the present disclosure. The end effector 202 includes a plurality of edge contact pads 210 (four shown in FIG. 2) which are coupled to a support member 204. The edge contact pads 210 can be used as the contact pads 118 depicted in FIG. 1. In some embodiments, the support member 204 is substantially planar, or includes a substantially planar region sufficient to support a substrate. In some embodiments, the support member 204 is formed of a ceramic material and may be doped with titanium. The titanium doped ceramic material is advantageously provides more resistance to droop as compared to conventional substrate transfer robot blades. In addition, the titanium doped ceramic support member is advantageously electrically conductive. The end effector 202 may also include a feature 206, such as a hole, which may be used to for substrate alignment purposes and/or weight reduction of the end effector 202. A distance L between front and back edge contact pads 210 is slightly larger than a diameter of a substrate being processed. For example, the distance L may be about 304 mm for handling substrates having a 300 mm diameter. However, the distance L will depend upon the size of the substrate being handled.

Figure 3:
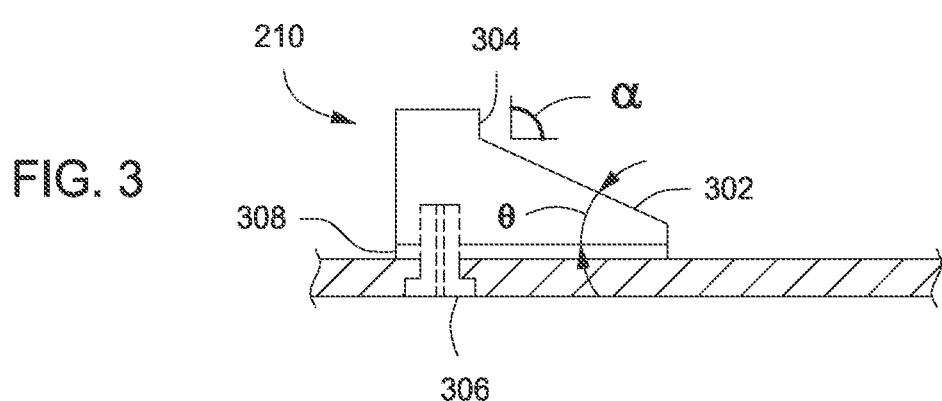
FIG. 3 depicts a side sectional view of a portion of a substrate transfer robot blade in accordance with some embodiments of the present disclosure.

FIG. 3 depicts a side view of an edge contact pad 210 in accordance with some embodiments of the present disclosure. The edge contact pad 210 includes a first contact surface 302 and a second contact surface 304. The first contact surface 302 is at a first angle θ with respect to the support member 204. The second contact surface 304 is at a second angle α with respect to the support member 204. Due to the weight of the substrate 150 and inertial forces caused by movement of the substrate 150 by the substrate transfer robot 100, each edge contact pad 210 imparts a normal (frictional) force and a radial force on the substrate. The radial force is directed towards a center of the substrate 150 to ensure that it remains stationary. In order to ensure a sufficient magnitude of frictional and radial forces on the substrate, the first angle θ may be between about 3 degrees and 5 degrees. The first angle θ is small enough to ensure that a radial force directed towards a center of the substrate exists while maintaining sufficient frictional forces to prevent sliding of the substrate. A horizontal length of the first contact surface 302 may be between about 4 mm to about 7 mm, preferably about 5.8 mm. The second angle α is larger than the first angle θ so that the second contact surface 304 is substantially vertical. The second contact surface 304 acts as a bumper in case the substrate slides during placement.

The edge contact pad 210 is coupled to the support member 204 of the end effector 202. In some embodiments, one or more screws 306 may be used to couple the edge contact pad 210 to the support member 204. The screws 306 include a through hole to ensure evacuation of any air pockets between the screw 306 and the edge contact pad 210. In some embodiments, one or more shims 308 may be used to control the height of the edge contact pad 210 above the support member 204, thus advantageously ensuring that the substrate is correctly leveled on all of edge contact pads.

Figure 4:
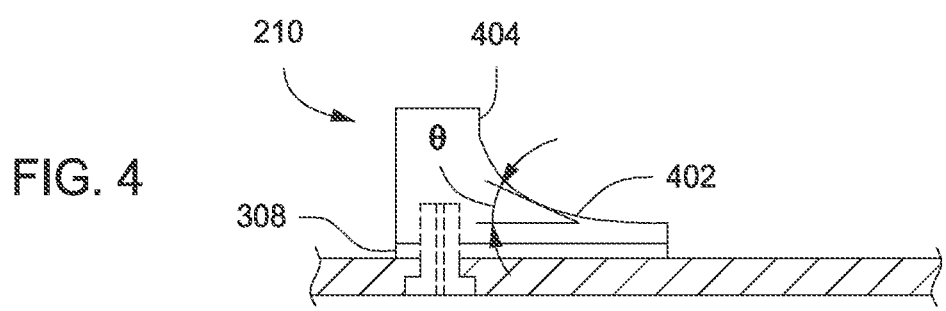
FIG. 4 depicts a side sectional view of a portion of a substrate transfer robot blade in accordance with some embodiments of the present disclosure.

FIG. 4 depicts a perspective view of an edge contact pad 210 in accordance with some embodiments of the present disclosure. The edge contact pad 210 depicted in FIG. 4 is similar to the edge contact pad 210 shown in FIG. 3 except that the edge contact pad 210 in FIG. 4 includes a first contact surface 402 and a second contact surface 404 that are curved (as compared to the linear surfaces shown in FIG. 3). The inventors have discovered that by providing a curved contact surface, the frictional and radial forces applied to the substrate vary depending on the position of the substrate. As such, if the substrate slides, the radial forces acting on the substrate increase or decrease depending upon the position of the substrate with respect to the edge contact pad 210. For example, the radial forces will be higher where the substrate is at a higher angle and lower where the substrate is at a lower angle. As a result, further sliding of the substrate in a particular direction is limited or prevented. An angle θ between the first and second contact surfaces 402, 404 and the horizontal plane varies from at or near 0 degrees at the beginning of the first contact surface 402 to at or near 90 degrees at the end of the second contact surface 404. The first contact surface 402 (e.g., the portion of the curved surface at lesser angles and more radially inward) functions as a support surface for a substrate placed thereon and the second contact surface (e.g., the portion of the curved surface at greater angles and more radially outward) functions as a bumper to prevent sliding of the substrate. The first and second contact surfaces 402, 404 form a continuous curved surface. Alternatively, a combination of curved an linear surfaces may be used providing shallower angles to support the substrate and greater angles to prevent further movement of the substrate in case of slippage.

Figure 5:
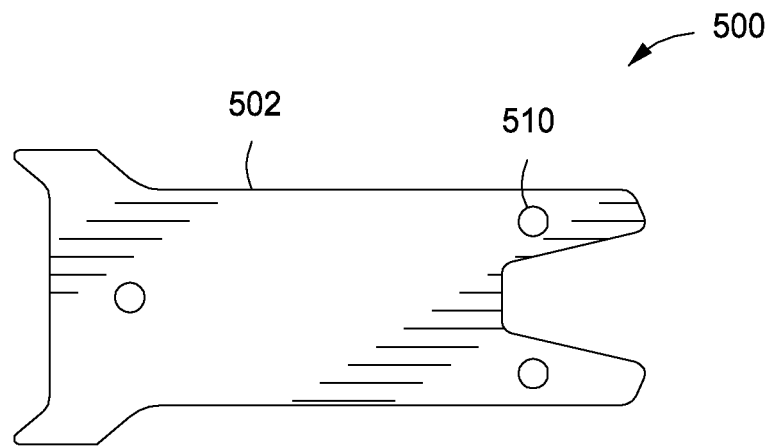
FIG. 5 depicts a plan view of an end effector of a substrate transfer robot in accordance with some embodiments of the present disclosure.
Figure 6:
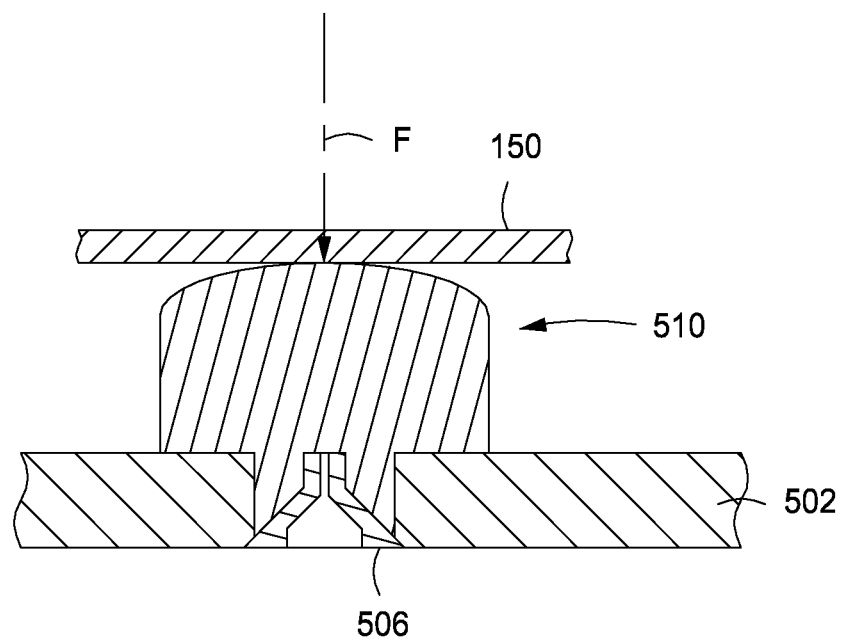
FIG. 6 depicts a side sectional view of a portion of a substrate transfer robot blade in accordance with some embodiments of the present disclosure.

FIG. 5 depicts an end effector 500 in accordance with some embodiments of the present disclosure. The end effector 500 includes backside contact pads 510 coupled to a support member 502 of the end effector 500 to support a substrate by the backside of the substrate, rather than the edges as described above with respect to FIGS. 2-4. The backside contact pads 510 can be used as the contact pads 118 depicted in FIG. 1. When the substrate transfer robot lifts the substrate 150 off of the lift pins 120, the substrate 150 is accelerated from a velocity of zero to a transfer speed. The acceleration results in a force F at contact areas corresponding to the locations of the contact pads 118, as illustrated in FIG. 6. As a result, particles are generated at the contact area between the backside contact pads 510 and the substrate 150.

Similar to the edge contact pads 210, 210, the backside contact pads 510 may be coupled to the support member 502 of the end effector 500 using screws 506. The screws 506 may be vented to facilitate venting of any air gap between the screw and the backside contact pad 510. Although not shown, shims similar to those depicted in FIGS. 3 and 4 may be used to raise any of the backside contact pads 510 to ensure proper leveling of the substrate 150 when placed thereon.

Thus, improved apparatus and materials for avoiding particle generation on a substrate have been disclosed herein. The inventive apparatus may advantageously allow for the reduction or prevention of contamination accumulated on a substrate during the manufacturing process, such as during handling the substrate between process steps and while supporting the substrate inside a process chamber, thus preventing or reducing the incidence of contaminants from reaching the front-side of a substrate and causing reduced device performance and/or yield loss.

While the foregoing is directed to embodiments of the present disclosure, other and further embodiments of the disclosure may be devised without departing from the basic scope thereof.

The invention claimed is:

1. An apparatus for supporting a substrate, comprising:
a support member; and
a plurality of substrate contact elements protruding from the support member, wherein each of the plurality of substrate contact elements comprises:
a first contact surface to support a substrate when placed thereon; and
a second contact surface extending from the first contact surface,
wherein the second contact surface is adjacent a periphery of the substrate to prevent radial movement of the substrate,
wherein the first contact surface is at a first angle with respect to the support member and the second contact surface is at a second angle with respect to the support member, and
wherein the first angle is between about 3 degrees and 5 degrees,
wherein the plurality of substrate contact elements are coupled to the support member with a plurality of screws, and
wherein each of the plurality of screws includes a through hole to evacuate an air gap between each of the plurality of screws and the support member.

2. The apparatus of claim 1, wherein the second angle is greater than the first angle.

3. The apparatus of claim 1, wherein the first contact surface and the second contact surface form a continuous curved surface.

4. The apparatus of claim 1, wherein the first contact surface is configured to apply frictional and radial forces to prevent sliding of the substrate.

5. The apparatus of claim 1, wherein a horizontal length of the first contact surface is between about 4 mm and 7 mm.

6. The apparatus of claim 1, wherein the plurality of substrate contact elements are formed of one or more of aluminum oxide, silicon nitride, stainless steel, or an electrically conductive plastic.

7. An apparatus for supporting a substrate, comprising:
a support member;
a plurality of substrate contact elements protruding from the support member, wherein each of the plurality of substrate contact elements comprises:
a first contact surface to support a substrate when placed thereon; and
a second contact surface extending from the first contact surface, wherein the second contact surface is adjacent a periphery of the substrate to prevent radial movement of the substrate, wherein the first contact surface is at a first angle with respect to the support member and the second contact surface is at a second angle with respect to the support member, and wherein the first angle is between about 3 degrees and 5 degrees; and
one or more shims disposed between the support member and one or more of the plurality of substrate contact elements.

8. The apparatus of claim 7, wherein the plurality of substrate contact elements are coupled to the support member with a plurality of screws.

9. The apparatus of claim 8, wherein each of the plurality of screws includes a through hole to ensure evacuation of an air gap between each of the plurality of screws and the support member.

10. A substrate transfer robot for transferring a substrate, comprising:
an arm including a blade;
a plurality of substrate contact elements protruding from an upper surface of the blade, wherein each of the plurality of substrate contact elements comprises:
a first contact surface to support a substrate when placed thereon; and
a second contact surface extending from the first contact surface, wherein the second contact surface is adjacent a periphery of the substrate to prevent radial movement of the substrate, wherein the first contact surface is at a first angle with respect to the upper surface and the second contact surface is at a second angle with respect to the upper surface, and wherein the first angle is between about 3 degrees and 5 degrees; and one or more shims disposed between the upper surface of the blade and one or more of the plurality of substrate contact elements.

11. The substrate transfer robot of claim 10, wherein the second angle is greater than the first angle.

12. The substrate transfer robot of claim 10, wherein the first contact surface and the second contact surface form a continuous curved surface.

13. The substrate transfer robot of claim 10, wherein the first contact surface is configured to apply frictional and radial forces to prevent sliding of the substrate.

14. The substrate transfer robot of claim 10, wherein a horizontal length of the first contact surface is between about 4 mm and 7 mm.

15. The substrate transfer robot of claim 10, wherein the plurality of substrate contact elements are coupled to the blade with a plurality of screws.

16. The substrate transfer robot of claim 15, wherein each of the plurality of screws includes a through hole to ensure evacuation of an air gap between each of the plurality of screws and the blade.

17. The substrate transfer robot of claim 10, wherein the plurality of substrate contact elements are formed of one of aluminum oxide, silicon nitride, stainless steel, or an electrically conductive plastic.

18. The substrate transfer robot of claim 10, wherein the blade is formed of an electrically conductive titanium-doped ceramic.

* * * * *